(12) United States Patent
Sengupta et al.

(10) Patent No.: US 7,598,793 B1
(45) Date of Patent: Oct. 6, 2009

(54) CAPACITANCE MULTIPLIER CIRCUIT

(75) Inventors: Susanta Sengupta, Leander, TX (US); Kenneth Charles Barnett, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 7 days.

(21) Appl. No.: 12/053,388

(22) Filed: Mar. 21, 2008

(51) Int. Cl.
*H03H 11/40* (2006.01)
(52) U.S. Cl. ........................ 327/524; 327/334
(58) Field of Classification Search ............ 327/334, 327/524
See application file for complete search history.

(56) References Cited

U.S. PATENT DOCUMENTS 5,327,027 A * 7/1994 Taylor ..................... 327/524
6,812,778 B1 * 11/2004 Yeo et al. .................. 327/541
6,943,619 B1 * 9/2005 Shuler, Jr. ................. 327/554

* cited by examiner

*Primary Examiner*—Kenneth B. Wells
(74) *Attorney, Agent, or Firm*—Jiayu Xu

(57) ABSTRACT

A capacitance multiplier circuit is configured to sense a current through a capacitor in an RC filter of the circuit and to multiply the current so as to achieve a capacitance multiplier effect without adding additional circuitry or requiring additional power. The circuit includes an RC filter, a first signal path connected to a filter output, and a second signal path connected to an input to the filter. A current output through the filter ($i_{out}$) is split between the two paths, sensed in the first path and multiplied in the second path. The multiplied current is fed back from the second path to the filter input to raise the effective capacitance of capacitor C. The capacitance multiplier circuit, in raising the effective capacitance of the capacitor in the filter, does not affect the frequency response, linearity performance and/or stability of the overall circuit.

29 Claims, 5 Drawing Sheets

CAPACITANCE MULTIPLIER CIRCUIT

FIELD OF DISCLOSURE

Example embodiments in general relate to a capacitance multiplier circuit and to a transimpedance amplifier (TIA) circuit having a capacitance multiplier.

BACKGROUND

Typically in system-on-chip (SoC) integration, on-chip capacitors occupy substantial silicon real estate, thus it is desirable to reduce the amount of surface area it takes up on the chip. One way to address this problem has been to employ capacitance multiplier circuits on the chip, so that a smaller 1× capacitor can be formed on the chip, but with capacitance multiplication is able to function in a circuit on the chip as a 5× or 10× capacitor, depending on the design requirements for capacitance in the circuit.

Capacitance multipliers can be broadly classified into two basic categories; voltage-based capacitance multipliers such as Miller capacitance multipliers; and current-based capacitance multipliers. A Miller capacitance multiplier, in its basic form, senses a voltage through the capacitor and feeds back a voltage. In a current-based capacitance multiplier, a current through a capacitor is sensed, multiplied and fed back to the filter to raise the effective capacitance.

However, a Miller capacitance multiplier requires adding additional power and circuitry, known as an active capacitor multiplier to an existing circuit, such as a transimpedance amplifier (TIA), for example. This additional circuitry causes the signal to flow through additional nodes which may cause additional poles and zeros affecting the frequency response of the overall amplifier circuit with the additional active capacitor multiplier circuit. Accordingly, this additional circuitry is undesirable on a small chip surface, and the frequency response stability of the overall circuit may be adversely affected.

In a conventional current sensing capacitance multiplier, a circuit senses current through a capacitor and multiplies the current with a resulting increase in the effective capacitance. In a conventional example, the multiplier circuit includes metal oxide semiconductor (MOS) transistor or a bipolar device which forms a current mirror with another MOS transistor or bipolar device, and senses current through an RC filter. In this conventional current sensing capacitance multiplier circuit, the multiplier circuit multiplies the current while mirroring back the current to an input node. However, the transconductance (1/gm) of the MOS transistor that senses the current and that is part of the current mirror in the circuit acts as a series lossy resistor to the capacitor. This resistance must be reduced by having to apply more current to other transistors that make up the circuit. Accordingly, the conventional current sensing capacitance multiplier requires substantial additional power in order to achieve a capacitance multiplier effect.

SUMMARY

An embodiment of the invention can include a capacitance multiplier circuit, comprising: a filter comprising a resistor (R), a capacitor (C) and an input; a first output branch connected to the filter to sense an output current ($i_{out}$) through the filter, and a second output branch in parallel with the first output branch to multiply the sensed $i_{out}$ based on a multiplier K, wherein K is greater than 1, the second output branch coupled to a feedback path to feedback the multiplied value of $i_{out}$ to the input of the filter to realize a larger effective C.

Another embodiment of the invention can include, a transimpedance amplifier (TIA) circuit, comprising: an amplifier coupled between a pair of RC filters, each filter configured to filter a signal generated by the amplifier; a pair of first output branches, each coupled to a respective filter output; and a pair of second output branches, each in parallel with a corresponding first output branch, wherein each first output branch is configured to sense an output current ($i_{out}$) through its corresponding filter, and each second output branch is configured to multiply the sensed $i_{out}$ as a function of an integer multiplier K, wherein K is greater than 1 and configured to feed back the multiplied $i_{out}$ to the respective filter inputs to realize a larger effective capacitance in the TIA circuit.

Another embodiment of the invention can include, an apparatus including a capacitance multiplier circuit, the circuit comprising: a filter having a resistor (R) in parallel with a capacitor (C); a first signal path coupled to a filter output; and a second signal path coupled to an input to the filter wherein a current output through the filter ($i_{out}$) is split between the two paths, sensed in the first path and multiplied in the second path, the multiplied current being fed back from the second path to the filter input to increase the effective capacitance of the capacitor (C).

Another embodiment of the invention can include, a method for capacitance multiplying comprising: sensing a current ($i_{out}$) from a filter in a first path, wherein the filter includes an input coupled to a resistor (R) in parallel with a capacitor (C); multiplying the sensed current ($i_{out}$) in a second path by multiplier K, wherein K is greater than 1, and wherein the second path is in parallel with the first path; and feeding back the multiplied current from the second path to the filter input to increase the effective capacitance of capacitor (C).

Another embodiment of the invention can include, an apparatus for capacitance multiplying comprising: means for sensing a current ($i_{out}$) from a filter in a first path, wherein the filter includes an input coupled to a resistor (R) in parallel with a capacitor (C); means for multiplying the sensed current ($i_{out}$) in a second path by a multiplier K, wherein K is greater than 1, and wherein the second path is in parallel with the first path; and means for feeding back the multiplied current from the second path to the filter input to increase the effective capacitance of capacitor (C).

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" or "example" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Example embodiments are directed to a capacitance multiplier circuit which senses the current through a capacitor in an RC filter of the circuit and multiplies the current. The example embodiments achieve a capacitance multiplier effect without adding additional circuitry or requiring additional power. The capacitance multiplier circuit, in raising the effective capacitance of the capacitor in the filter, does not affect the frequency response and/or stability of the overall circuit. Further, the example capacitance multiplier circuit herein does not affect the linearity performance of the overall circuit.

Figure 1A:
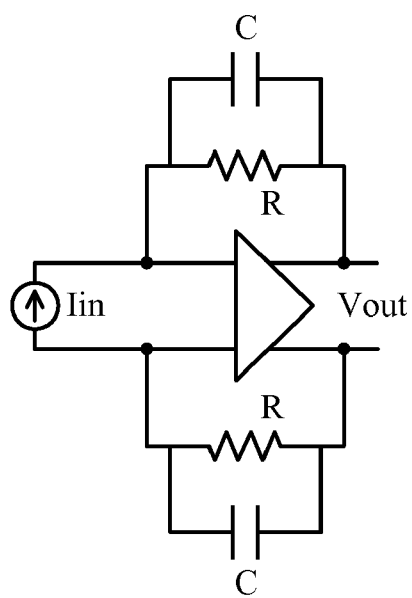
FIG. 1A is a conceptual block diagram of a conventional opamp RC circuit without capacitance multiplication.
Figure 1B:
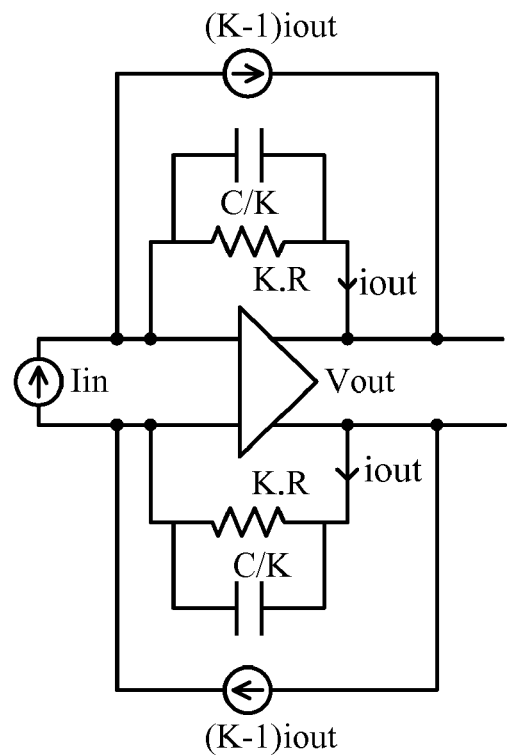
FIG. 1B is a conceptual block diagram of a capacitance multiplier circuit, shown as part of a transimpedance amplifier (TIA) circuit, in accordance with embodiments.

FIG. 1A is a conceptual block diagram of a conventional opamp RC circuit without capacitance multiplication. In particular, FIG. 1A illustrates a transimpedance amplifier (TIA) circuit with an RC filter. FIG. 1B is a conceptual block diagram of the same circuit as modified in accordance with the example embodiments. The conventional TIA circuit in FIG. 1A, which is an opamp with an RC filter, is shown as implementing an RC pole where typically the capacitance C is substantially large and the resistance is small to account for noise. The TIA circuit of FIG. 1A is used, in one example, after a mixer stage in a wireless receiver. The mixer down converts a high frequency RF signal into a low frequency IF or zero-IF signals along with undesirable high frequency signals. In order to filter out the unwanted frequencies, a low-pass filter circuit such as the TIA circuit is used. The TIA circuit accepts the current signals from the mixer (both the desired low frequency signal and undesired high frequency signals), and filters out the unwanted signals.

As shown in the circuit of FIG. 1B, if the current $i_{out}$ can be sensed and multiplied as a function of a multiplier K (shown here as K−1), the same RC pole as in FIG. 1A can be implemented with a K times smaller capacitance, as well as a K times larger resistance. Accordingly, in the block diagram of FIG. 1B, the output current from the RC filter is split up into two branches, a first branch carrying $i_{out}$, and a second branch that includes a current multiplier (shown as current source (K−1) $i_{out}$). This larger multiplied current may thus be fed back to the input of each RC filter.

In addition to splitting the RC filter output into two branches, the multiplier K is employed, where K can be zero, a positive fraction or any positive integer. As shown, one or more of the resistor R, capacitor C and $i_{out}$ is modified or scaled by the multiplier K. In FIG. 1B, the resistance value of each filter has been modified as K·R, and the capacitance value of each filter has been modified as C/K. This scaling ensures that both the gain and output voltage remains unchanged as compared to the conventional circuit in FIG. 1A.

Figure 2A:
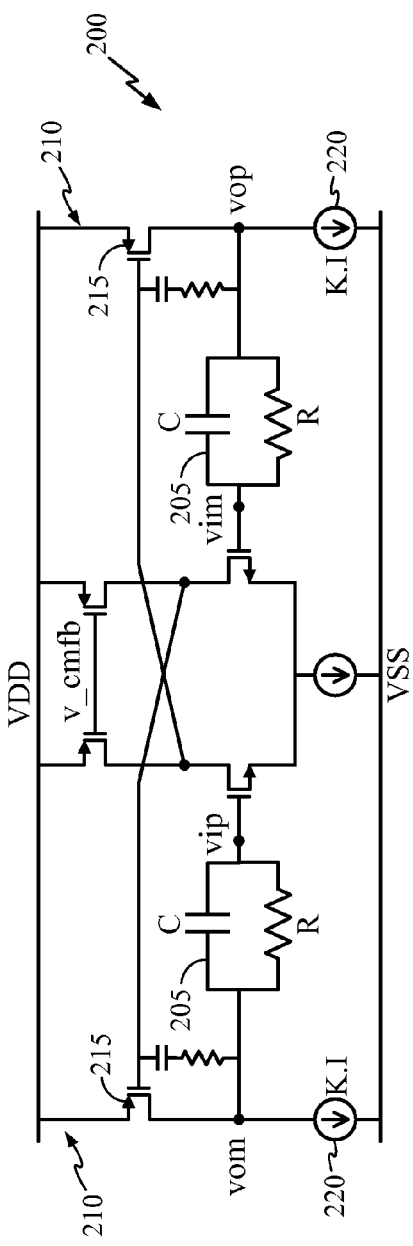
FIG. 2A is a schematic diagram of FIG. 1A to show circuit components in more detail.
Figure 2B:
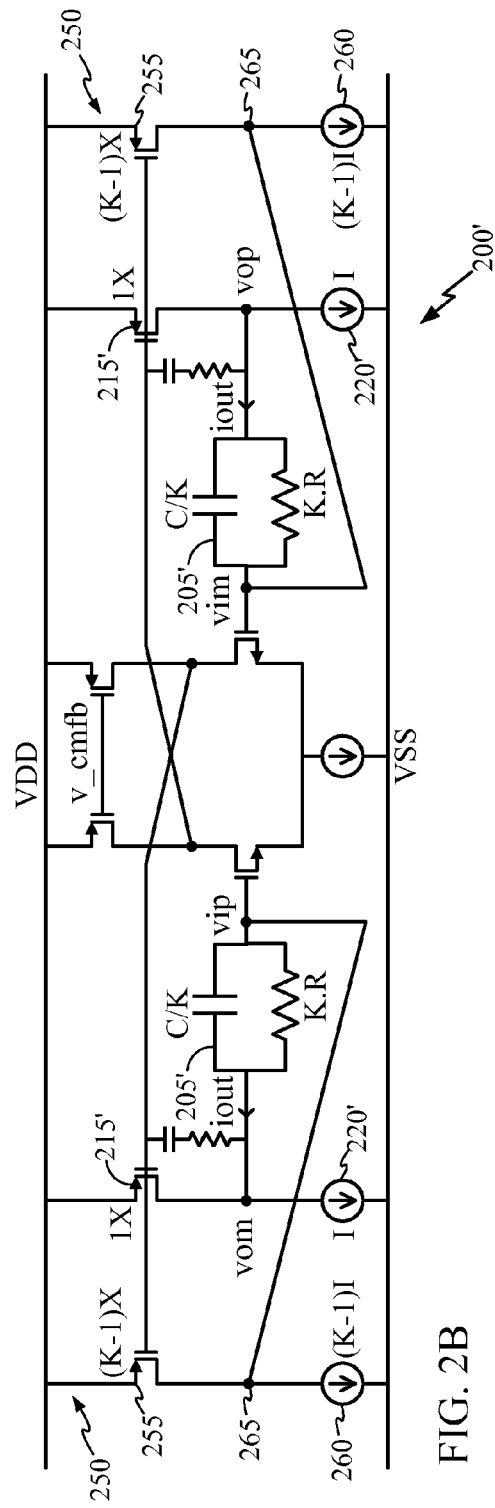
FIG. 2B is a schematic diagram of FIG. 1B to illustrate the circuit components in more detail.

FIG. 2A is a schematic diagram of FIG. 1A to show the circuit components in more detail; FIG. 2B is a schematic diagram of the conceptual diagram in FIG. 1B to illustrate the circuit components in more detail. For purposes of simplicity, a common mode feedback circuit that generates the bias voltage v_cmfb is not shown in the circuits of FIGS. 2A and 2B.

In FIG. 2A, the conventional opamp RC circuit 200 without capacitance multiplication includes RC filters 205 (low pass filters) between input nodes vip, vim and output nodes vom, vop. In order to account for noise requirements, the capacitance C in circuit 200 is typically substantially small (as on the order of tens of picofarads) and the resistance R is typically large (such as several kOhms). Each output node vom/vop is located in an output branch 210 and coupled between a PMOS transistor 215 and a current source 220. The current source 220 may be embodied as an NMOS transistor, for example.

PMOS transistor 215 acts as the supplier of output current. The DC current through PMOS transistor 215 is carried by current source 220. PMOS transistor 215 carries the output signal current and the DC current, but current source 220 carries only the DC current and no output current. In FIG. 2A, neither PMOS transistor 215 nor current source 220 performs capacitance multiplication.

In operation in FIG. 2A, the input voltages are applied to the input devices. The input signal is applied from node vip to the input of PMOS transistor 215, where the PMOS transistor 215 provides a voltage gain to the input signal. Next, PMOS transistor 215 converts this amplified input signal into an output current. If there is no signal, then PMOS transistor 215 carries only a DC current that flows through current source 220 to ground. But in the presence of an input signal PMOS transistor 215 carries both the output current and the DC current, with the output current flowing out into the RC branches of filter 205, and with the DC current flowing to current source 220.

The circuit 200' of FIG. 2B is similar in construction and operation to the circuit 200 of FIG. 2A, with the exception of the following. In the capacitance multiplier circuit 200' of FIG. 2B, the output current $i_{out}$ through each RF filter 205' is split into two branches, a first output branch 210' and a second output branch 250. Each branch 210', 250 is a replica of the branch 210 in FIG. 2A, albeit with differently sized PMOS transistors 215', 255 and differently scaled current sources 220', 260.

For example, in the capacitance multiplier circuit 200' of FIG. 2B, PMOS transistor 215 of FIG. 2A is split into two smaller devices, PMOS transistor 215' and 255. Thus, the ratings and size of the two devices and 215' and 255 in FIG. 2B collectively equal that of PMOS transistor 215 of FIG. 2A. The same splitting is done with current source 220, splitting it into two smaller devices (see current sources 220' and 260) which collectively have the same size and characteristics/rating of current source 220. Accordingly, no additional power or additional larger devices have been added to circuit 200'; a larger device 215/220 has been split into two smaller devices (215'/255 and 220'/265).

As the split provides two output paths, now a part of the output current (in PMOS transistor 215') is flowing into the filter 205' through resistor branch KR and capacitor branch C/K. This output current is K times smaller compared to the same current in FIG. 2A flowing in the R and C branches. In other words, since the R has increased by K times and C has been reduced by K times, the impedance has increased by K times, which requires K times less current. Additionally, because of the current mirror action between PMOS transistors 215 and 255, PMOS transistor 255 now carries (K−1) times the current flowing through the KR and C/K branches of filter 205'. Of note, the currents through both branches add up at the vip node (or vim mode); thus the currents at the vip/vim nodes in FIGS. 2A and 2B are the same, with the exception that the circuit 200' of FIG. 2B saves a substantial amount of capacitance.

Accordingly, there is no change to any of the other device components in the circuit 200' of FIG. 2B, as compared to circuit 200 in FIG. 2A, with the exception of splitting the output branch into two paths (the two output branches 210', 250) and employing a multiplier K (which can be a fraction or integer, K>1) to modify one or more of the capacitor C and the resistor R of each filter 205', as well as to modify or scale one or both of the PMOS transistors 215', 255 and one or both of the current sources 220', 260 as discussed above.

In adding the additional branch 250, a size ratio is set between the two PMOS transistors 215', 255 in branches 210', 250 as a function of K, to 1X and (K−1)X respectively, where X represents a unit cell. The first and second PMOS transistors 215', 255 are sized in a ratio of 1X:(K−1)X at the time of circuit 200' design. In sizing the PMOS devices in a ratio of 1X:(K−1)X, the PMOS transistors 215', 255 have the same gate-to-source voltage, which makes the current through each in the same ratio as their size ratio.

Each second output branch 250 includes a node 265 between the drain of PMOS transistor 255 and the current source 260. The node 265 is connected to an input to the filter 205' (at vim, vip) via a feedback path 270. Thus, the multiplied current in the second output branch 250 is fed back at node 265 on the feedback path 270 to the inputs vim, vip of the filters 205'.

Each of the current sources 220', 260 in FIG. 2B have a different multiplier scaling as compared to the current source 220 in the conventional opamp RC circuit 200 of FIG. 2A. The current source 220' in the first output branch has no multiplier, i.e., it is just I, whereas the current source 260 in the second branch generates current as (K−1)I, where K is a fraction or an integer multiplier K>1. Adding the two currents from the sources 220', 260 in the two output branches 210', 250 gives the same current KI generated from current source 220 in FIG. 2A.

The current sources 220', 260 can each be implemented by an NMOS transistor. The NMOS transistors serving as the current sources 220', 260 in the first and second output branches can be sized, during circuit design so as to have the same ratio as the PMOS transistors 215', 255. For example, the first and second NMOS transistors can be sized during circuit design so that the ratio of current in the first output branch 210' to the second output branch 250 is 1:K−1.

In an example, K can be set to a fixed value at the design of circuit 200' so as to achieve the desired ratios between the two PMOS transistors 215', 255 and the two current sources 220', 260 (NMOS transistors). This sets the desired ratios of current in the two branches ($i_{out}$ and $(K-1)i_{out}$) where the multiplied current $(K-1)i_{out}$ current is fed back via paths 270 to the inputs vim, vip of the filters 205'.

Accordingly, to achieve a larger effective capacitance in the circuit 200', the output current $i_{out}$ through the capacitor (having a capacitance of C/K) and the resistor (having a resistance of K·R) of the filter 205' is sensed by PMOS transistor 215' in the first output branch 210', is multiplied K−1 times at PMOS transistor 255 in the second output branch 250, and is then fed back at node 265 via the feedback path 270 to the input nodes vim/vip of the filter 205'. This results in an effective capacitance of C and an effective resistance R (as in the circuit 200 of FIG. 2A), but using a capacitance that is K times smaller (and a K times larger resistance). In this configuration, no additional power is consumed, and the linearity, frequency response and gain compensation remain the same as in the conventional TIA stage of FIG. 2A. In other words, the voltage output remains the same from each filter 205'; the node voltages at vom and vop do not change as each of the Ks cancel each other (C/K*K·R) in the low pass filter 205' such that the same RC pole is achieved but with K times smaller capacitance (and K times larger resistance).

The example multiplier circuit has been described above as part of a TIA opamp circuit. However, the multiplier circuit with split branches and feedback can be incorporated into a transconductor-capacitor (Gm C) filter, in which the opamp in FIG. 2B is replaced with a Gm (transconductance) stage. In typical communication systems such as wireless receivers, a transconductor-capacitor (Gm C) filter can be an important building block of the receiver. A transconductor is an element that delivers an output current ic that is proportional to the input signal voltage Vin. For a bipolar device, the following relationship exists: ic=gm*Vin, where gm is the transconductance of the element. In general, the larger the transconductance, the greater the gain. When a capacitor is connected to the output of a transconductor, an integrator is formed. Monolithic filters may thus be implemented using Gm C integrators. Accordingly, the example embodiments include a Gm C filter with a capacitance multiplier as shown in FIGS. 1B and 2B.

Figure 3:
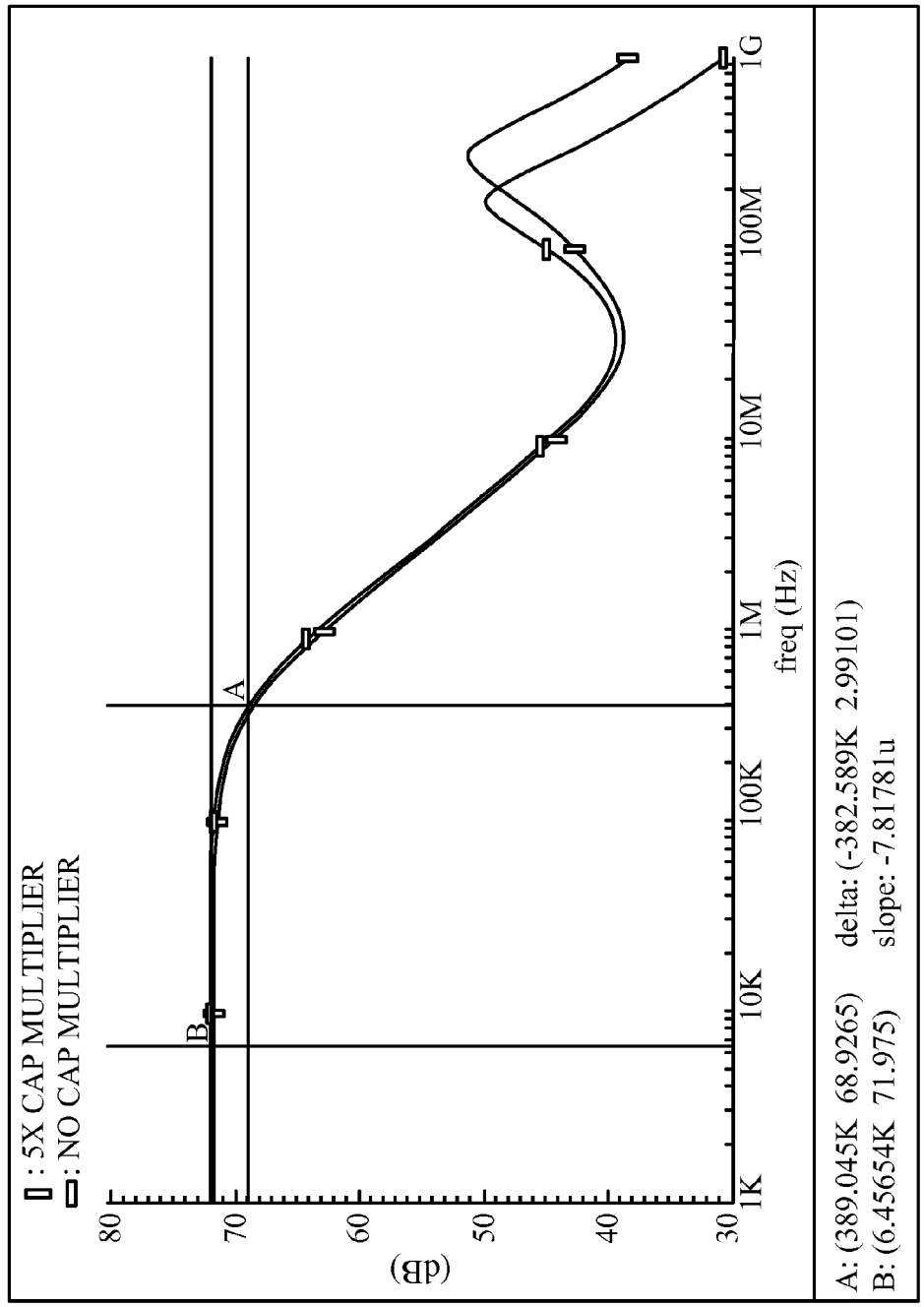
FIG. 3 is a screenshot of AC simulation results for a TIA circuit modeled with and without a capacitance multiplier.

FIG. 3 is a screenshot of AC simulation results for a TIA circuit modeled with and without a capacitance multiplier. FIG. 3 is provided to illustrate the frequency response of the capacitance multiplier. In the simulation exercise, a TIA circuit without a capacitance multiplier (curve labeled NO CAP MULTIPLIER) and with a capacitance multiplier (curve labeled 5× CAP MULTIPLIER) was modeled. The goal for both curves was to implement an RC pole frequency at 383 KHz.

For the TIA circuit modeled with no capacitance multiplier, the resistance R of the RC filter was maintained at 2025Ω. Without capacitance multiplication, the capacitance C needed to be set at 205 pF to achieve the RC pole. The lighter curve illustrates a circuit utilizing capacitance multiplication. For the TIA circuit modeled with no capacitance multiplier, a 41 pF capacitor was multiplied five times (5×) to achieve the same RC pole at 383 KHz with a resistance R at 10.125 KΩ. Accordingly, the two curves, which mirrored each other in the region of interest for the filter (modeled a low pass filter at 1 MHz and below), illustrate that the frequency response is basically the same for both circuit configurations.

Figure 4:
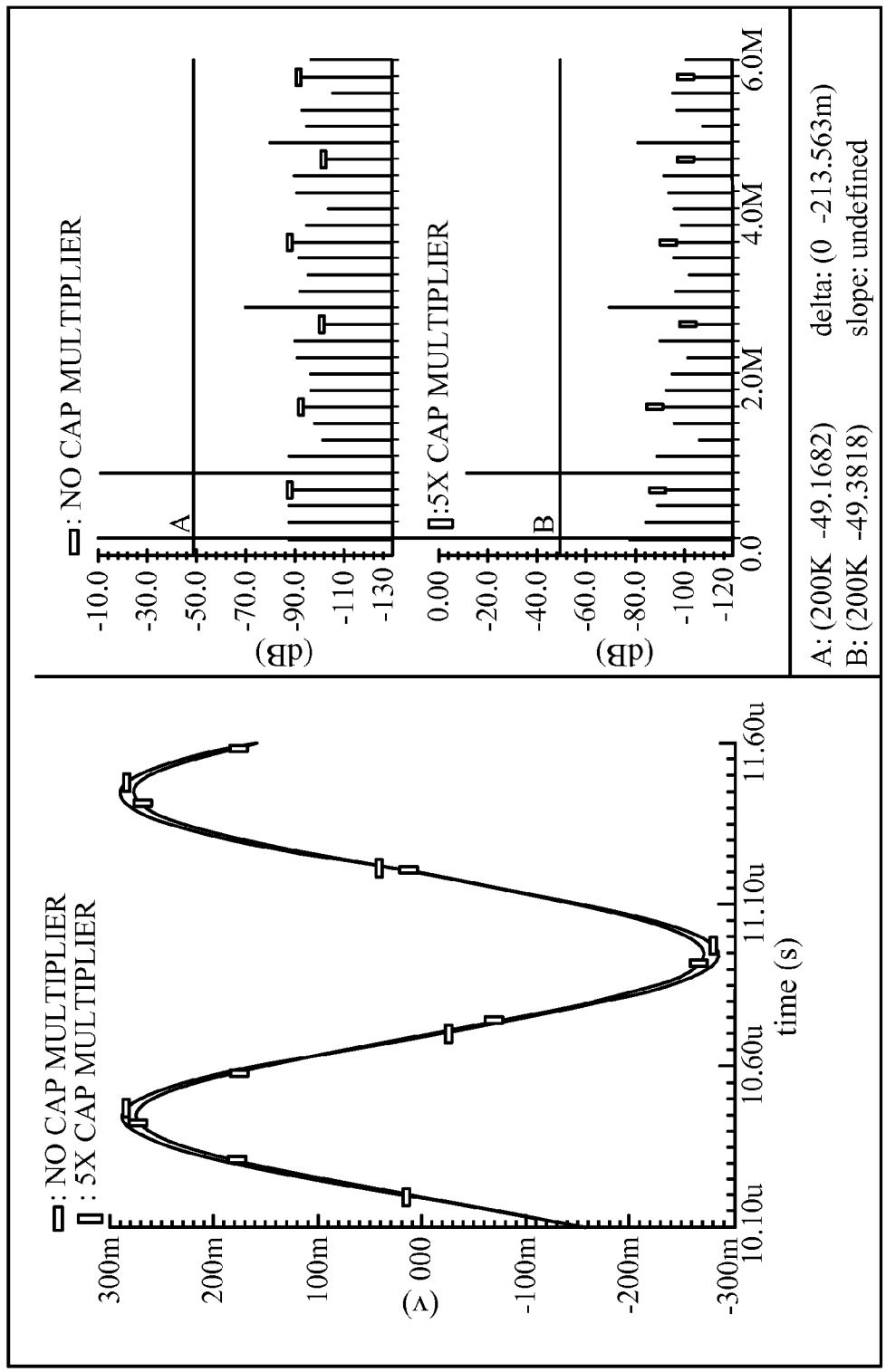
FIG. 4 is a screenshot illustrating transient simulation results of the capacitance multiplier.

FIG. 4 is a screenshot illustrating transient simulation results of the capacitance multiplier. As in FIG. 3, a TIA circuit with a 5× multiplier and without any capacitance multiplier was simulated with a small signal at 200 KHz and then sharply influenced as the filter in the modeled circuits was hit with a large 1 MHz signal in order to study the transient response. Of note, this is a situation analogous to where a mixer stage provides a desired signal of 200 kHz and an unwanted frequency of 1 MHz (with an amplitude 100 times stronger than that of the 200 kHz signal).

In FIG. 4, the transient response is shown on the left-hand side of the screenshot, and the frequency spectrum components of both circuits are shown on the right-hand side. The transient simulation results shown on the left side of FIG. 4 illustrate that the performance by the filter upon being supplied with the 1 MHz signal are about the same for both circuit configurations. The frequency spectrum responses on the right hand side show that all frequency components are in the same exact spectrum for the TIA stage with no capacitance multiplier and the TIA stage with the 5× capacitance multiplier. This indicates that as all frequency components are in basically the same spectrum, there is no degradation in linearity.

Accordingly, the example embodiments achieve a capacitance multiplier effect without adding additional circuitry or requiring additional power. The example capacitance multiplier circuit, in raising the effective capacitance of the capacitor in the filter, does not affect the frequency response and/or stability of the overall circuit, and does not adversely affect the linearity performance of the overall circuit.

Figure 5:
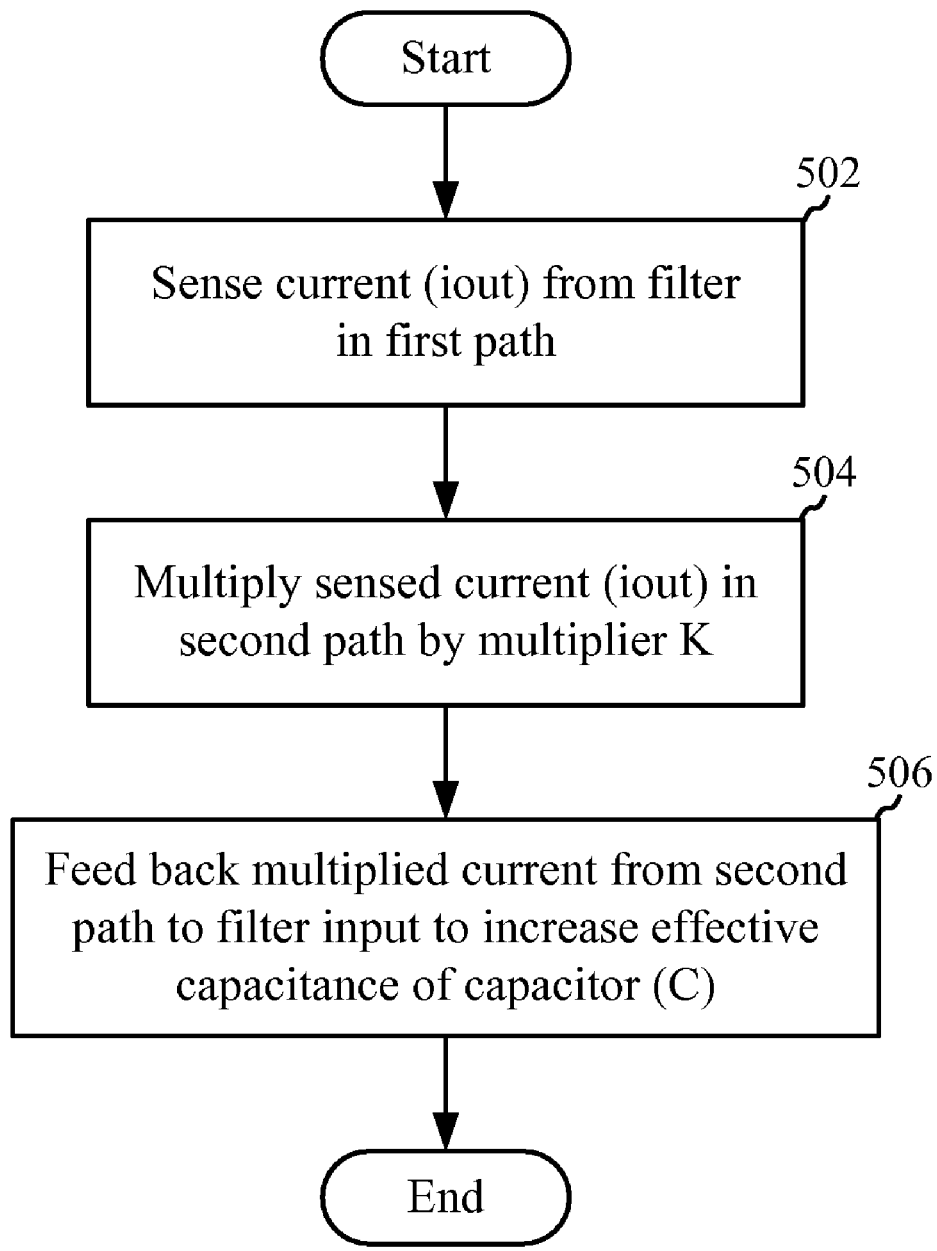
FIG. 5 is a flowchart illustrating a method capacitance multiplying.

In view of the foregoing, it will be appreciated that embodiments of the invention can include methods for performing the functions, sequence of actions and/or algorithms described herein. For example, FIG. 5 is a flow diagram illustrating a method for capacitance multiplying, the method including sensing a current (iout) from a filter in a first path, the filter including an input coupled to a resistor (R) in parallel with a capacitor (C) (block 502); multiplying the sensed current (iout) in a second path by a multiplier K, K being greater than 1 and the second path being in parallel with the first path (block 504); and feeding back the multiplied current from the second path to the filter input to increase the effective capacitance of capacitor (C) (block 506).

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A capacitance multiplier circuit, comprising:
   a filter comprising a resistor (R), a capacitor (C) and an input;
   a first output branch connected to the filter to sense an output current ($i_{out}$) through the filter; and
   a second output branch in parallel with the first output branch to multiply the sensed $i_{out}$ based on a multiplier K, wherein K is greater than 1, the second output branch coupled to a feedback path to feedback the multiplied value of $i_{out}$ to the input of the filter to realize a larger effective C.

2. The circuit of claim 1, wherein one or more of the resistor (R), capacitor (C) or $i_{out}$ is modified by the multiplier K.

3. The circuit of claim 1, wherein the resistance value of the filter is K·R.

4. The circuit of claim 1, wherein the capacitance value of the filter is C/K.

5. The circuit of claim 1, wherein the first output branch has no feedback path to the filter input and includes a first PMOS transistor that senses $i_{out}$ and generates a first current in the first output branch.

6. The circuit of claim 5, wherein the second output branch includes a second PMOS transistor that multiplies $i_{out}$ and generates a second current in the second output branch.

7. The circuit of claim 6, wherein
   the second output branch further includes a node and a current source, the node coupled between the drain of the second PMOS transistor and the current source, and
   the second node is coupled to a feedback path that is connected to an input to the filter, the second larger current being fed back on the feedback path to the filter input to realize a larger effective C.

8. The circuit of claim 6, wherein the first and second PMOS transistors are sized in a ratio of 1:(K−1).

9. The circuit of claim 1, wherein each of the first and second output branches includes a current source.

10. The circuit of claim 9, wherein the current source in the first output branch is embodied by a first NMOS transistor and the current source in the second output branch is embodied by a second NMOS transistor, the first and second NMOS transistors sized so that the ratio of current in the first to second branches is 1:(K−1).

11. A transimpedance amplifier (TIA) circuit, comprising:
   an amplifier coupled between a pair of RC filters, each filter configured to filter a signal generated by the amplifier;
   a pair of first output branches, each coupled to a respective filter output; and
   a pair of second output branches, each in parallel with a corresponding first output branch,
   wherein each first output branch is configured to sense an output current ($i_{out}$) through its corresponding filter, and each second output branch is configured to multiply the sensed $i_{out}$ as a function of an integer multiplier K, wherein K is greater than 1 and configured to feed back the multiplied $i_{out}$ to the respective filter inputs to realize a larger effective capacitance in the TIA circuit.

12. The circuit of claim 11, wherein the resistance value of each filter is K·R and the capacitance value of each filter is C/K.

13. The circuit of claim 12, wherein,
each first output branch has no feedback path to its filter input and includes a first PMOS transistor that senses $i_{out}$ and generates a first current therefrom, and
each second output branch includes a second PMOS transistor that multiplies $i_{out}$ to generate a second larger current, and includes a feedback path between a node in the second output branch and the filter input to feedback the second current to the filter, the ratio of currents in the first and second output branches being 1:(K−1).

14. The circuit of claim 13, wherein the first and second PMOS transistors are sized in a ratio of 1:(K−1).

15. An apparatus including a capacitance multiplier circuit, comprising:
a filter having a resistor (R) in parallel with a capacitor (C);
a first signal path coupled to a filter output; and
a second signal path coupled to an input to the filter, wherein a current output through the filter ($i_{out}$) is split between the two paths, sensed in the first path and multiplied in the second path, the multiplied current being fed back from the second path to the filter input to increase the effective capacitance of the capacitor (C).

16. The circuit of claim 15, wherein $i_{out}$ in the second path is multiplied by a multiplier K, wherein K is greater than 1.

17. The circuit of claim 15, wherein the resistance value of the filter is K·R and the capacitance value of the filter is C/K, wherein K is greater than 1.

18. The circuit of claim 15, wherein
the first path has no feedback to the filter input and includes a first PMOS transistor to sense $i_{out}$ and generate a first current in the first path, and
the second path includes a second PMOS transistor to multiply the sensed $i_{out}$ and to output a second current in the second path, the ratio of currents in the first and second paths being 1:(K−1).

19. The circuit of claim 18, wherein the first and second PMOS transistors are sized in a ratio of 1:(K−1).

20. The apparatus of claim 15, wherein the apparatus is a transimpedance amplifier (TIA) circuit.

21. The apparatus of claim 15, wherein the apparatus is a transconductor-capacitor (GmC) filter circuit.

22. The apparatus of claim 15, wherein the apparatus is a wireless device.

23. A method for capacitance multiplying comprising:
sensing a current ($i_{out}$) from a filter in a first path, wherein the filter includes an input coupled to a resistor (R) in parallel with a capacitor (C);
multiplying the sensed current ($i_{out}$) in a second path by a multiplier K, wherein K is greater than 1, and wherein the second path is in parallel with the first path; and
feeding back the multiplied current from the second path to the filter input to increase the effective capacitance of capacitor (C).

24. The method of claim 23, wherein the resistance value of the filter is K·R and the capacitance value of the filter is C/K.

25. The method of claim 23, wherein
the first path has no feedback to the filter input, and
the ratio of currents in the first and second paths is 1:(K−1).

26. An apparatus for capacitance multiplying comprising:
means for sensing a current ($i_{out}$) from a filter in a first path, wherein the filter includes an input coupled to a resistor (R) in parallel with a capacitor (C);
means for multiplying the sensed current ($i_{out}$) in a second path by a multiplier K, wherein K is greater than 1, and wherein the second path is in parallel with the first path; and
means for feeding back the multiplied current from the second path to the filter input to increase the effective capacitance of capacitor (C).

27. The apparatus of claim 26, wherein the resistance value of the filter is K·R and the capacitance value of the filter is C/K, wherein K is greater than 1.

28. The apparatus of claim 26, wherein
the first path has no feedback to the filter input, and
the ratio of currents in the first and second paths is 1:(K−1).

29. The apparatus of claim 26, wherein the apparatus is a transimpedance amplifier (TIA) circuit, a transconductor-capacitor (GmC) filter circuit, or a wireless device.

* * * * *